(12) United States Patent
Schuetz et al.

(10) Patent No.: US 8,541,845 B2
(45) Date of Patent: Sep. 24, 2013

(54) SEMICONDUCTOR DISCHARGE DEVICES AND METHODS OF FORMATION THEREOF

(75) Inventors: Alfred Schuetz, Germering (DE); Andreas Martin, Munich (DE); Gunnar Zimmermann, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 313 days.

(21) Appl. No.: 13/004,334

(22) Filed: Jan. 11, 2011

(65) Prior Publication Data

US 2012/0175708 A1 Jul. 12, 2012

(51) Int. Cl.
*H01L 27/092* (2006.01)
*H01L 21/336* (2006.01)

(52) U.S. Cl.
USPC ............ 257/360; 257/E27.067; 257/E21.409; 438/154; 438/197; 438/710

(58) Field of Classification Search
USPC .......... 257/257, 360, 369, E27.062, E27.067, 257/E21.409; 438/154, 197, 218, 233, 710
See application file for complete search history.

(56) References Cited

U.S. PATENT DOCUMENTS 6,117,714 A 9/2000 Beatty
6,627,555 B2 * 9/2003 Eitan et al. ................... 438/710

* cited by examiner

*Primary Examiner* — Julio J Maldonado
*Assistant Examiner* — Daniel Shook
(74) *Attorney, Agent, or Firm* — Slater & Matsil, L.L.P.

(57) ABSTRACT

In one embodiment, a method of forming a semiconductor device includes forming a well region within a substrate. A plurality of transistors is formed within and/or over the well region. The method further includes forming a first discharge device within the substrate. The first discharge device is coupled to the well region and a low voltage node. During subsequent processing, the first discharge device discharges charge from the well region.

41 Claims, 17 Drawing Sheets

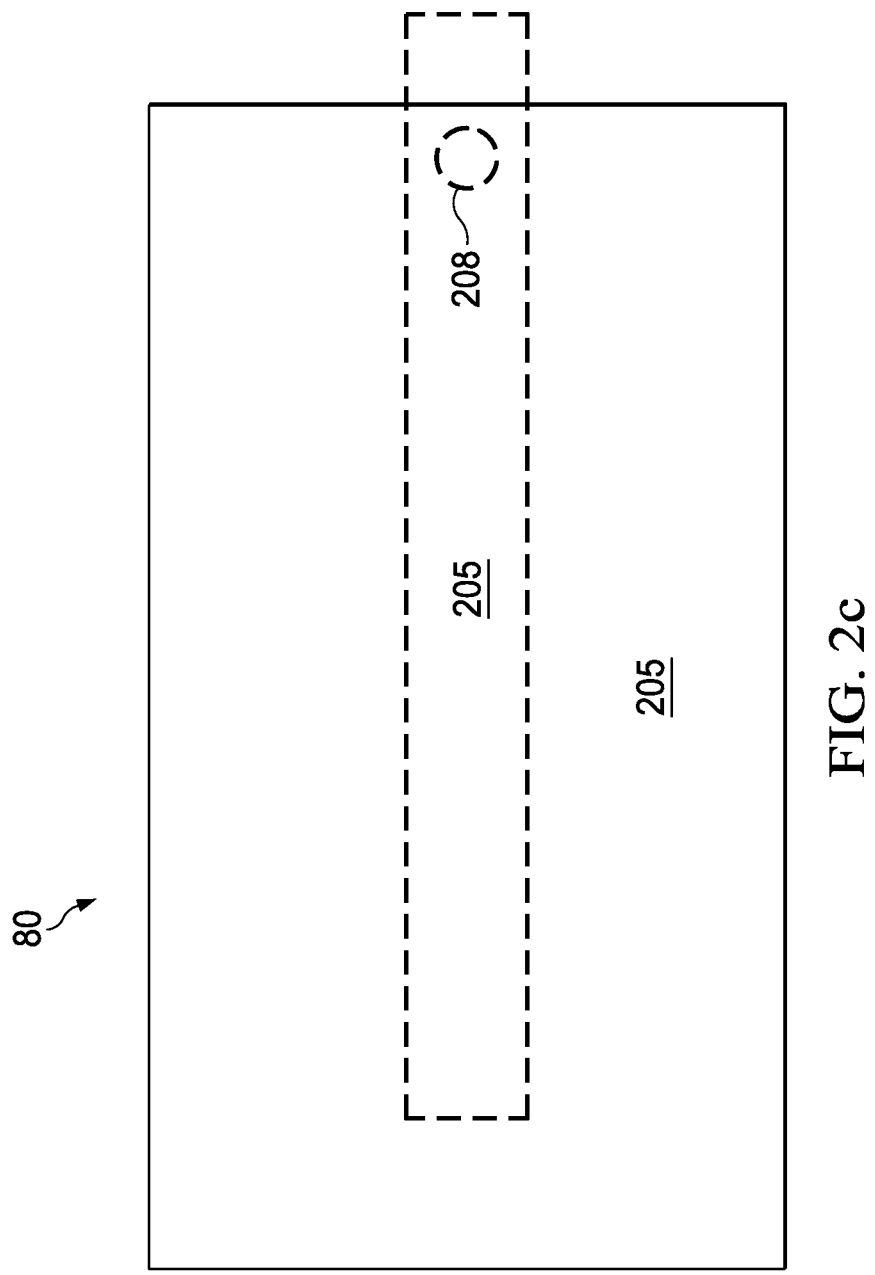

SEMICONDUCTOR DISCHARGE DEVICES AND METHODS OF FORMATION THEREOF

TECHNICAL FIELD

The present invention relates generally to semiconductor devices, and in particular embodiments to semiconductor discharge devices and methods of formation thereof.

BACKGROUND

Plasma processes are used during deposition or etching of various material layers in semiconductor processing. Plasma processing offers many advantages over other alternative processing methods. As an example, low temperature may be used to deposit thin film layers than analogous thermal processes. Similarly, plasma enabled reactive ion etching allows almost vertical (anisotropic) etching of material layers which is not possible with purely chemical etching techniques which are isotropic.

However, plasma processes also have some disadvantages because of the nature of the plasma, which comprises charged ions. During plasma processing charged ions may interact with the workpiece transferring the charge to the workpiece. The charge may be trapped within a region of the workpiece and may have deleterious consequences due to charge damage for the subsequent operation of the device. The susceptibility or degree of device damage depends on the stage of device fabrication and the specific device design.

Hence, what are needed circuits, devices, and methods of manufacturing to reduce plasma-induced damage in a workpiece.

SUMMARY OF THE INVENTION

These and other problems are generally solved or circumvented, and technical advantages are generally achieved, by illustrative embodiments of the present invention.

In accordance with an embodiment of the present invention, a semiconductor structure comprises a well region having a plurality of transistors. A first discharge device comprises a first transistor having a first source/drain region, a second source/drain region, and a first gate region. The well region and the first discharge device are disposed in a substrate. The first source/drain region is coupled to the well region, and the second source/drain region is coupled to a low voltage node. The first gate region is coupled to a first antenna.

In accordance with another embodiment of the present invention, a method of forming a semiconductor structure includes forming a first well region comprising a plurality of transistors in a first region of a substrate. A second well region is formed in a second region of the substrate. A first discharge device is formed in the substrate, the first discharge device being coupled between the first well region and the second well region. Charge from the first well region is transferred to the second well region through the first discharge device during subsequent steps of fabricating the semiconductor structure.

In accordance with another embodiment of the present invention, a method of forming a semiconductor device comprises forming a first well region having a first doping type within a substrate. A second well region having a second doping type is formed within the first well region, the second doping type being opposite to the first doping type. A third well region having the first doping type is formed within the second well region, the third well region comprising a plurality of transistors. A first transistor is formed within and/or above the substrate, the first transistor being coupled between the third well region and a low voltage node. During subsequent fabrication of the semiconductor device, charge accumulated in the third well region is discharged using the first transistor.

In accordance with another embodiment of the present invention, a method of forming a semiconductor device comprises forming a well region within a substrate. The method further comprises forming a plurality of transistors within and/or over the well region. A first discharge device is formed within the substrate. The first discharge device comprises a first transistor having a first source/drain region, a second source/drain region, and a first gate region. The first source/drain region is coupled to the well region, and the second source/drain region is coupled to a low voltage node. A first portion of a first antenna is formed over the first gate region such that the first gate region is coupled to the first portion of the first antenna. A first metallization layer is formed over the well region using a first plasma process. The first discharge device is configured to conduct during the first plasma process.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2a-2e, illustrates a semiconductor device illustrating a discharge device including a p-channel transistor in accordance with an embodiment of the invention, wherein FIGS. 2a, 2c and 2e illustrates a top view, and FIGS. 2b and 2d illustrate cross sectional views;

FIG. 3, which includes

FIG. 4, which includes

FIG. 5, which includes FIGS. 5a-5b, illustrates a discharge device in accordance with an alternative embodiment of the invention, wherein FIG. 5a illustrates a top view and FIG. 5b illustrates a cross sectional view, employing a pMOS discharge device and regions isolated from the substrate by epi-layer and trenches filled with insulating material;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context. In various embodiments, a discharge device is used to remove charge build up from well regions or SOI islands or deep trench regions of a semiconductor wafer during plasma processing.

Figure 1:
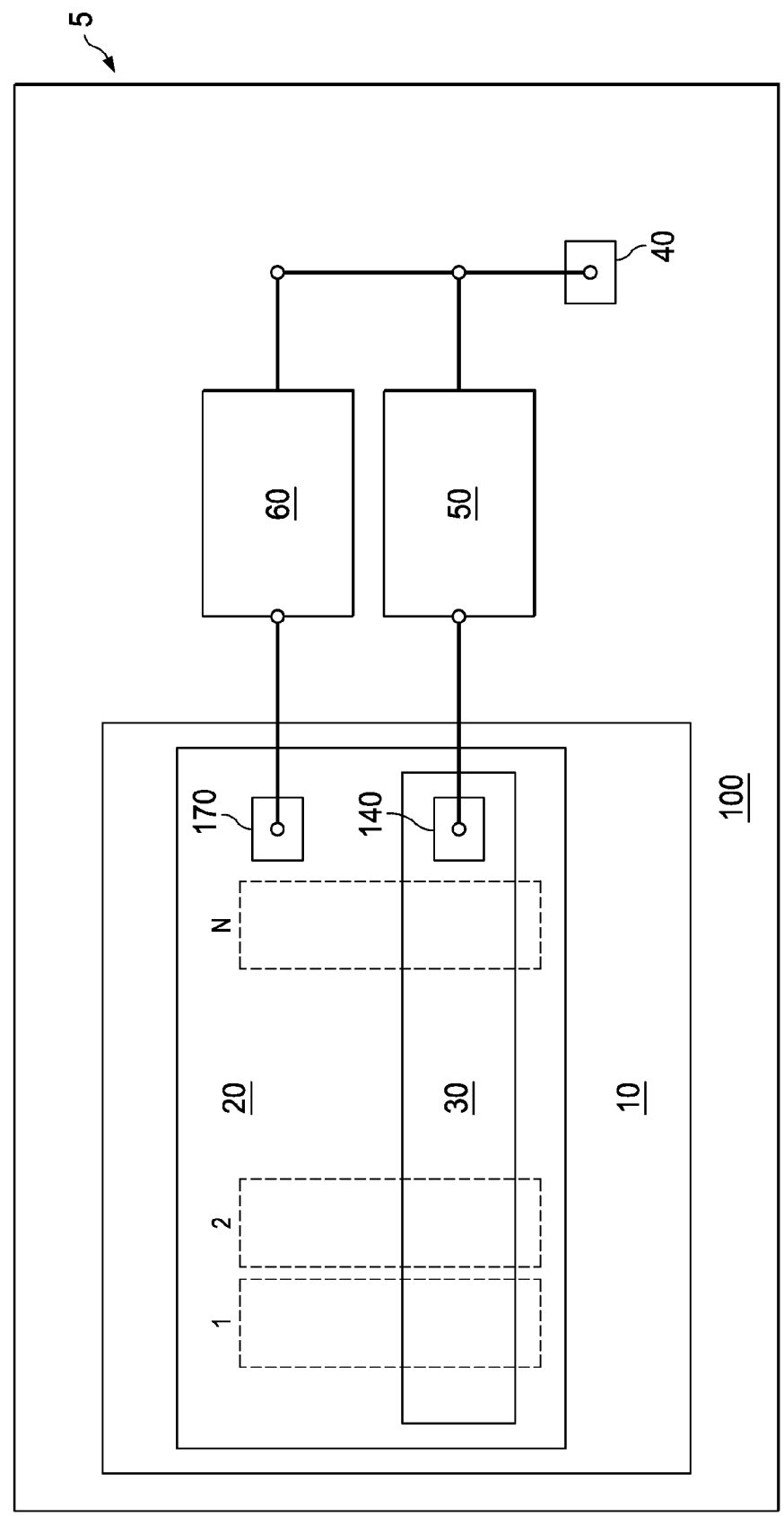
FIG. 1 illustrates a semiconductor device in accordance with an embodiment of the invention.

A schematic embodiment of the discharge device will be first described using FIG. 1. Various structural embodiments of the discharge device will be described using FIGS. 2-7. The discharging process during a plasma process will be described using FIG. 8.

FIG. 1 illustrates a semiconductor device in accordance with an embodiment of the invention.

Referring to FIG. 1, a device array 5 of a chip is disposed on a base substrate 100 as illustrated in a top view of the semiconductor device. The substrate 100 may be a silicon substrate and may include epitaxial layers and/or trenches filled with insulating material. The substrate 100 may be a bulk substrate in various embodiments. In some embodiments, the substrate 100 may be a silicon on insulator substrate. In alternative embodiments, the substrate 100 may be other semiconductor materials such as SiGe, SiC, and compound semiconductors. The device array 5 is formed on a plurality of wells in various embodiments. In one embodiment, the transistor array 5 is formed on a triple well. A first well region 10 is disposed over and/or within the substrate 100. A second well region 20 is disposed within the first well region 10, and a third well region 30 is disposed within the second well region 20. The first, the second, the third well regions 10, 20, and 30 may be formed using conventional processing, for example, using ion implantation, diffusion and/or epitaxial regrowth.

In various embodiments, the device array 5 may be part of logic, memory, analog, mixed signal, or other circuitry of the semiconductor device. In various embodiments, the device array 5 may comprise active device regions and include arrays of transistors, resistors, capacitors, inductors or other components used to form integrated circuits.

In one embodiment, a first type of device is formed in the second well region 20, and a second type of device is formed in the third well region 30. For example, if the second well region 20 comprises an n-type doping, a first type of device comprising p-channel transistors (PMOS) may be formed within the second well region 20. Similarly, if the third well region 30 comprises p-type doping, a second type of device comprising n-channel transistors (NMOS) may be formed within the third well region 30. In one embodiment, an array of CMOS devices, e.g., inverters, may thus be fabricated, the array having e.g., N inverter stages as illustrated in FIG. 1 by dashed rectangles.

In various embodiments, active areas that include transistors (e.g., CMOS transistors) can be separated from one another by isolation regions (e.g., shallow trench isolation, or deep trench in connection with an epi-lyer), which are not illustrated.

Referring to FIG. 1, a third well contact 170 is disposed on the second well region 20 and enables electrical contact with the second well region 20. Similarly, a second well contact 140 is disposed on the third well region 30 and enables electrical contact with the third well region 30.

Metallization layers (not shown) comprising a plurality of metal lines are formed over the base substrate 100. The metallization layers are disposed over the active device regions, e.g., device array 5. The metallization layers electrically contact and interconnect the active devices. The metallization layers and the active device regions together form a complete functional integrated circuit. In other words, the electrical functions of the chip can be performed by the interconnected active circuitry. Logic devices may include many metallization layers, e.g., nine or more, of copper or alternatively of other metals. Memory devices, such as DRAMs, may have less number of metal levels and may be aluminum. The metallization layers may be covered with additional passivation layer and other suitable contact structures.

As illustrated, a first discharge device 50 is coupled to the third well region 30, and a second discharge device 60 is coupled to the second well region 20. In some embodiments, only the first discharge device 50 or the second discharge device 60 may be present.

The first and the second discharge devices 50 and 60 are coupled to a low voltage node or a ground potential node through a substrate contact 40. The first and the second discharge devices 50 and 60 are configured to discharge any excess charge in the second well region 20 and the third well region 30. In one embodiment, the first and the second discharge devices 50 and 60 are configured to discharge either positive or negative charge build up although in some embodiments they may be charge specific. In various embodiments, the first and the second discharge devices 50 and 60 are otherwise electrically isolated from the device array 5 so that the first and the second discharge devices 50 and 60 do not interact with devices of the device array 5 or other functional circuits within the substrate 100 during product operation or product lifetime.

In various embodiments, first and the second discharge devices 50 and 60 are vestiges of the discharge circuitry used for discharging charge buildup during plasma processing while fabricating the semiconductor device.

During plasma processing especially when forming vias and metal lines over the device array 5, charge from the charged ions in the plasma is trapped by the workpiece and can accumulate into the well regions. Advantageously, in various embodiments, the switches in the discharge devices are configured to turn on (conduct) only when the wells are charged up during plasma processing. Therefore, any excess charge build up is removed from the wells through the discharge devices.

Charge in the wells can have the deleterious effect of changing the device characteristics of the device array in the second well region 20 and the third well region 30. For example, threshold voltages of transistors formed within charged wells may be different from transistors formed in un-charged wells. Even MOS gate oxide layers can deteriorate and start conducting high currents at low voltages (use conditions). By removing the excess floating charge, the discharge devices ensure improved device uniformity.

During normal product use, a switch within the discharge devices is turned off (not conducting). Consequently, the discharge device is not part of any circuitry of the semiconductor device during normal operation.

Figure 2A:
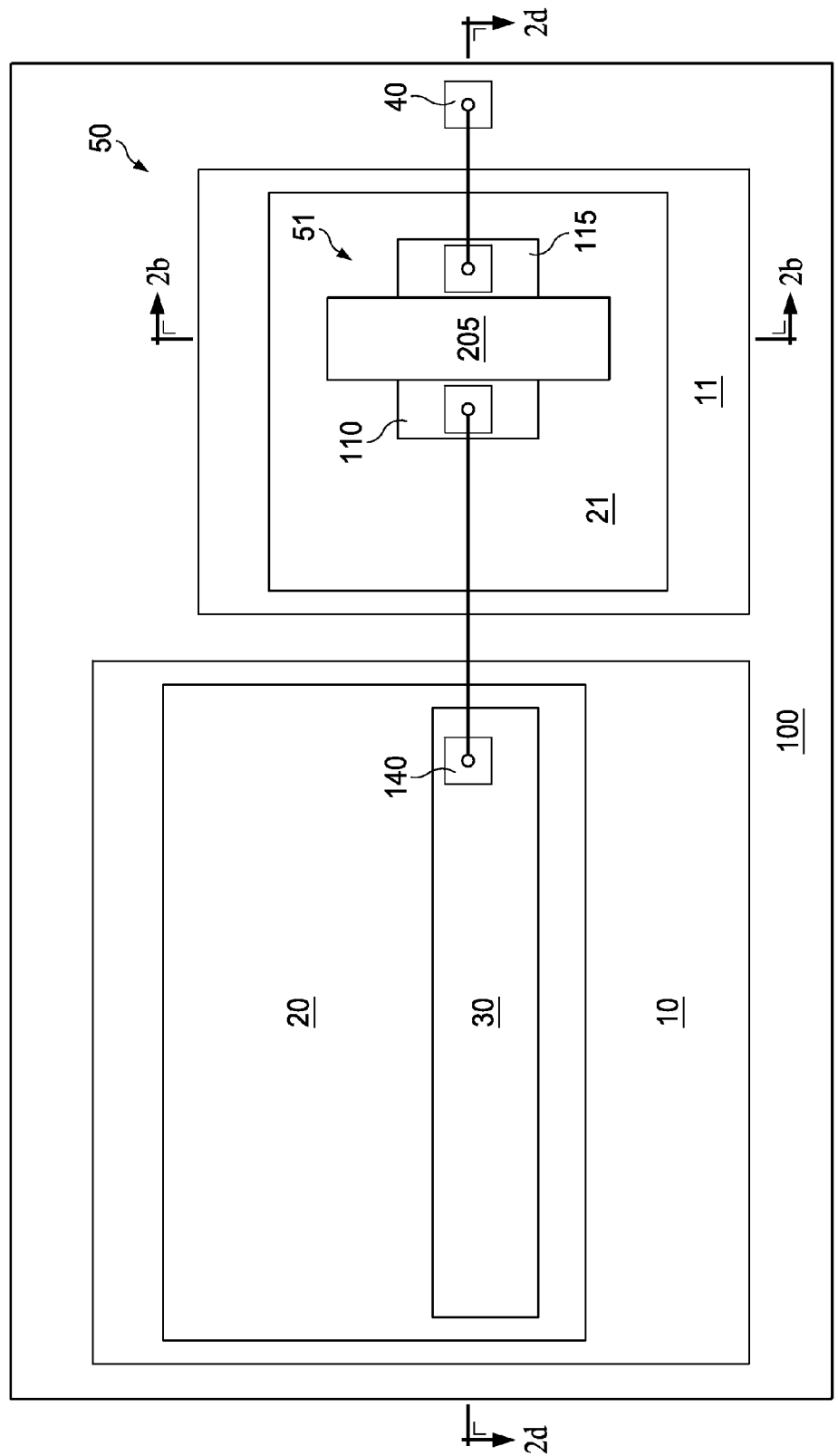
Figure 2B:
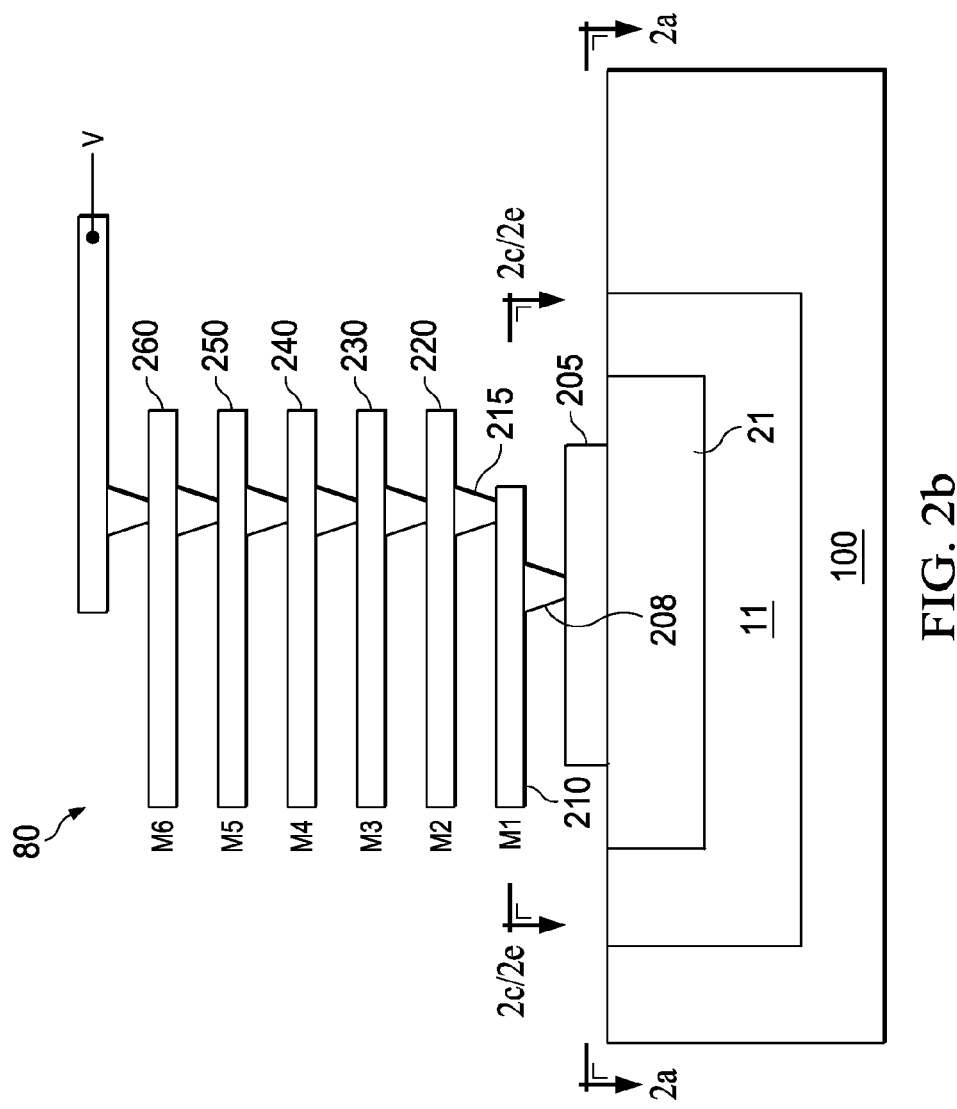
Figure 2D:
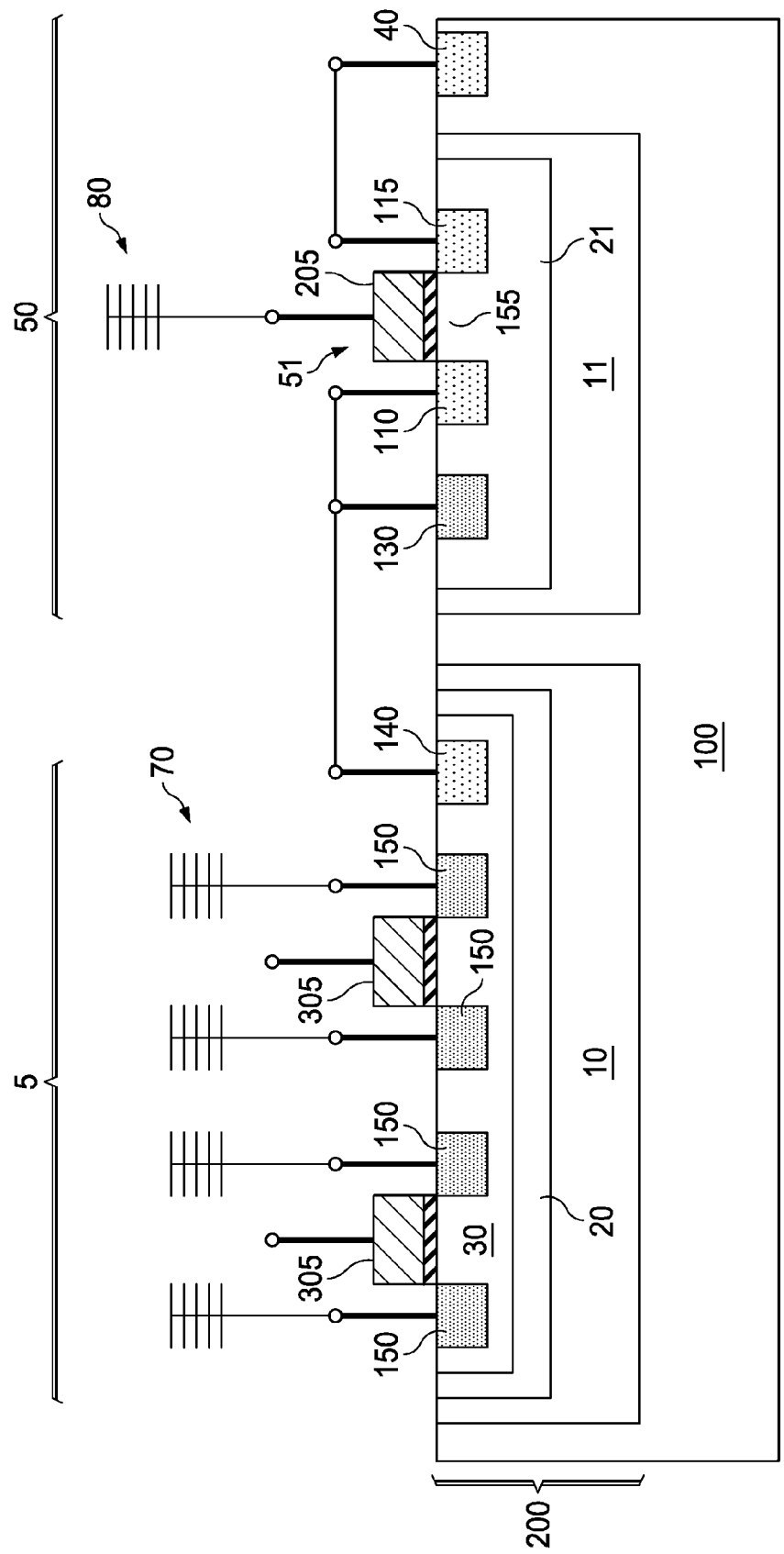
Figure 2E:
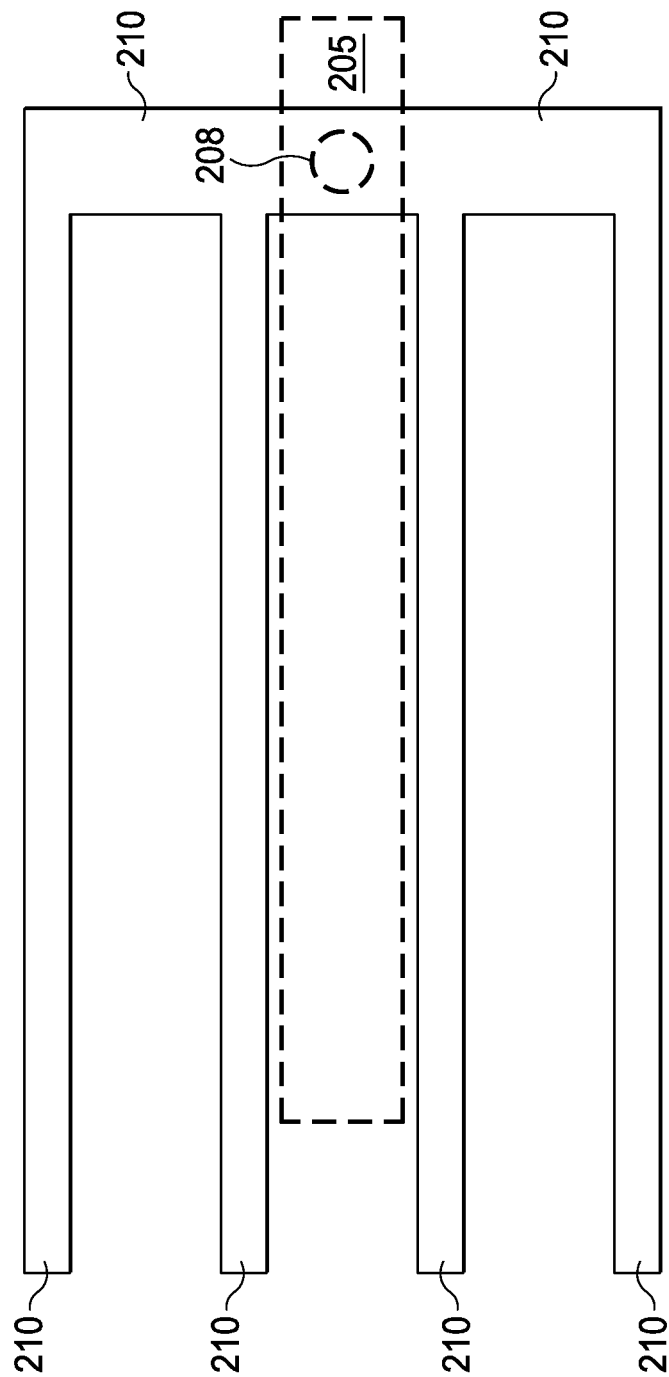

FIG. 2, which includes FIGS. 2a-2e, illustrates a semiconductor device in accordance with an embodiment of the invention, wherein FIGS. 2a, 2c, and 2e illustrate a top view, and FIGS. 2b and 2d illustrate cross sectional views.

Referring to FIG. 2a, a first well region 10 of first doping type is disposed over a substrate 100. A second well region 20 of second doping type is disposed within the first well region 10. A third well region 30 having the first doping type may be disposed within the second well region 20 in some embodiments. A first discharge device 50 is coupled to a second well region 20.

In various embodiments, the first discharge device 50 may be formed adjacent the second well region 20 in different configurations. Similarly, the length, width, and area of the first discharge device 50 may be selected in view of various factors including available technology specifications and the charge accumulation characteristics of the specific plasma processing used during fabrication.

In one embodiment, the first well region 10 and the third well region 30 comprise a same first type of doping (doping type based on net doping). In various embodiments, the third well region 30 may be doped more heavily than the first well region 10. The second well region 20 comprises a second type of doping opposite to the first type of doping. In one embodiment, the first type of doping is a p-type doping, whereas the second type of doping is an n-type doping.

The first discharge device 50 comprises a first transistor 51 having a first source/drain region 110, a second source/drain region 115, and a first gate region 205 overlying a channel region. In one embodiment, the first transistor 51 is a p-channel metal insulator semiconductor transistor. The first source/drain region 110 is coupled to the third well region 30 through a second well contact 140.

FIG. 2b illustrates a cross sectional view of the semiconductor device along the line 2b-2b in FIG. 2a. As illustrated in FIG. 2b, the first transistor 51 of the first discharge device 50 is formed over a second discharge device well region 21. The second discharge device well region 21 is formed within a first discharge device well region 11. The first discharge device well region 11 and the first well region 10 are formed together and comprise similar doping levels and doping type in various embodiments. The second discharge device well region 21 and the second well region 20 are formed together and comprise similar doping levels and doping type in various embodiments. For example, the channel region of the first transistor 51 comprises a same type of doping as the second well region 20.

As illustrated in FIG. 2b, a plurality of metallization layers is formed over the second discharge device well region 21. The plurality of metallization layers of the first transistor 51 of the first discharge device 50 form a first antenna 80. The first antenna 80 may be coupled to a positive voltage node V. The voltage node V may be used, for example, to control the first transistor 51 independently, e.g., during product use. The number of metallization layers over the first discharge device 50 may be the same as the number of metallization layers over the other regions of the semiconductor device, e.g., device array 5, in one embodiment.

The first antenna 80 includes a first metal line 210 in a first metal level M1, a second metal line 220 in a second metal level M2, a third metal line 230 in a third metal level M3, a fourth metal line 240 in a fourth metal level M4, a fifth metal line 250 in a fifth metal level M5, a sixth metal line 260 in a sixth metal level M6. The first metal line 210 is coupled to the first gate region 205 through a first contact plug 208. The metal lines are connected by vias, for example, first vias 215 couple first metal line 210 with second metal line 220. In various embodiments, more or less number of metal levels may be present. For example, logic devices such as microprocessor may include more number of metal levels whereas memory devices such as DRAM memories may have less number of metal levels.

FIG. 2c illustrates a top view of a first metallization layer forming the first antenna along the line 2c-2c in FIG. 2b.

The embodiment of FIG. 2c is used as an antenna structure for the first antenna 80 in embodiments using copper plating.

In one or more embodiments, each of the metal line of the first antenna 80 may comprise a suitable shape and might be located above or beside the discharge device. For example, in one or more embodiments, the first metal line 210, the third metal line 230, the second metal line 220, the fourth metal line 240, the fifth metal line 250, and the sixth metal line 260 may be formed as a square or a rectangular block.

The area of the first metal line 210 is much larger than the area of the first via 215 or first contact plug 208. Such a structure is advantageously used to enhance the collection of a particular type of charge, in this case, possibly negative charge.

In particular, each lower metallization layer of the first antenna 80 is exposed during the formation of subsequent metallization layers. Consequently, for example, the first antenna 80 captures a portion of the charge from the impinging plasma. The charge captured through the first antenna 80 can result in an increase or decrease at potential of the first gate region 205. Importantly, during the formation of each metal or via level, the lower portions of the first antenna 80 already formed functions as the antenna for the first transistor 51. In other words, the complete structure of the first antenna 80 may not be needed for the functioning of the discharge device in some embodiments.

During plasma processing, the accumulation of positive charge is more favored during the formation of vias for copper (Cu) or aluminum (Al) and narrow spacing lines for Al while the formation of wide spaced metal lines for Al and possibly metal surfaces for Cu or Al result in accumulation of negative charge. Therefore, to improve the sensitivity of the gate (thereby the first transistor 51) to plasma charging, the first antennas 80 include more areal density of metal lines than vias (as also illustrated in FIG. 2c). For example, in or more embodiments, in each metallization layer, a surface area of the metal lines is much larger than a surface area of the vias, and the area of vias are minimized. In one or more embodiments, in each metallization layer, a surface area of the metal lines is at least 50 times larger than a surface area of the vias.

The minimization of vias maximizes the accumulation of negative charge without annihilation (neutralization) thereby improving the potential at the gate region.

FIG. 2e illustrates an alternative embodiment in which the metal lines are formed using aluminum when metal lines are spaced wider.

FIG. 2d illustrates a cross sectional view of the semiconductor device along the line 2d-2d in FIG. 2a including MOS transistors of an inverter chain (1–N). For clarity, the structure of the first antenna 80 is not illustrated in this Figure. Rather, a schematic of the first antenna 80 is illustrated in FIG. 2d.

FIG. 2d illustrates a portion of the device array 5 having a plurality of transistors. The first discharge device 50 is coupled to the portion of the device array 5 overlying the third well region 30. Each transistor in the device array 5 includes a first array source/drain region 150 disposed within the third well region 30. The first array source/drain region 150 has a net doping opposite to that of the third well region 30, and is therefore of the second doping type. Hence, if the first doping type is p-type, the first array source/drain region 150 is n-type thereby forming an array having n-channel transistors.

As illustrated in FIG. 2d, each transistor is coupled to metallization layers, which are like antennas forming array antennas 70 comprising metal layers and vias. The first discharge device 50 is coupled to the third well region 30 through a second well contact 140 of the same type of doping as the well region 30. Further, the first discharge device 50 is isolated from the device array 5 through the substrate 100. The first discharge device 50 is coupled to the second well contact 140 through an interconnect, which may be formed through the first metal level M1 or a higher metal level. Alternatively, the first discharge device 50 is coupled to the second well contact 140 through a line (e.g., a poly/metal line) at the gate level.

The first discharge device 50 includes a first transistor 51 having a first source/drain region 110, a second source/drain region 115, and a first gate region 205 overlying a channel region. The first transistor 51 is formed within another second well region 20 (second discharge device well region 21) having a second type of net doping. A first gate dielectric layer 155 is disposed between the first gate region 205 and the channel region. In one embodiment, a first well contact 130 of the first transistor 51 is tied to the second well contact 140. The second source/drain region 115 is coupled to a substrate contact 40 thereby being coupled to the substrate potential.

In various embodiments, the first transistor 51 is designed to be a low voltage transistor having a low threshold voltage, for example, less than about 0.35 V. For example, in some embodiments, the threshold voltage of the first transistor 51 me be between about 0.05 V and about 0.5 V. The first transistor 51 is designed in its own well construct being insulated from the device array 5.

For a p-channel transistor, accumulation of negative charge can invert the channel region underlying the first gate region 205 resulting in conduction between the first and the second source/drain regions 110 and 115. Thus, if the third well 30 has an excess of negative charge, holes from the grounded substrate contact 40 can flow through the p-channel transistor and recombine with the excess electrons in the third well region 30 thereby discharging the excess charge.

FIG. 3, which includes FIGS. 3a-3e, illustrates an alternative embodiment of the first discharge device, wherein a second discharge device includes an n-channel transistor.

Figure 3A:
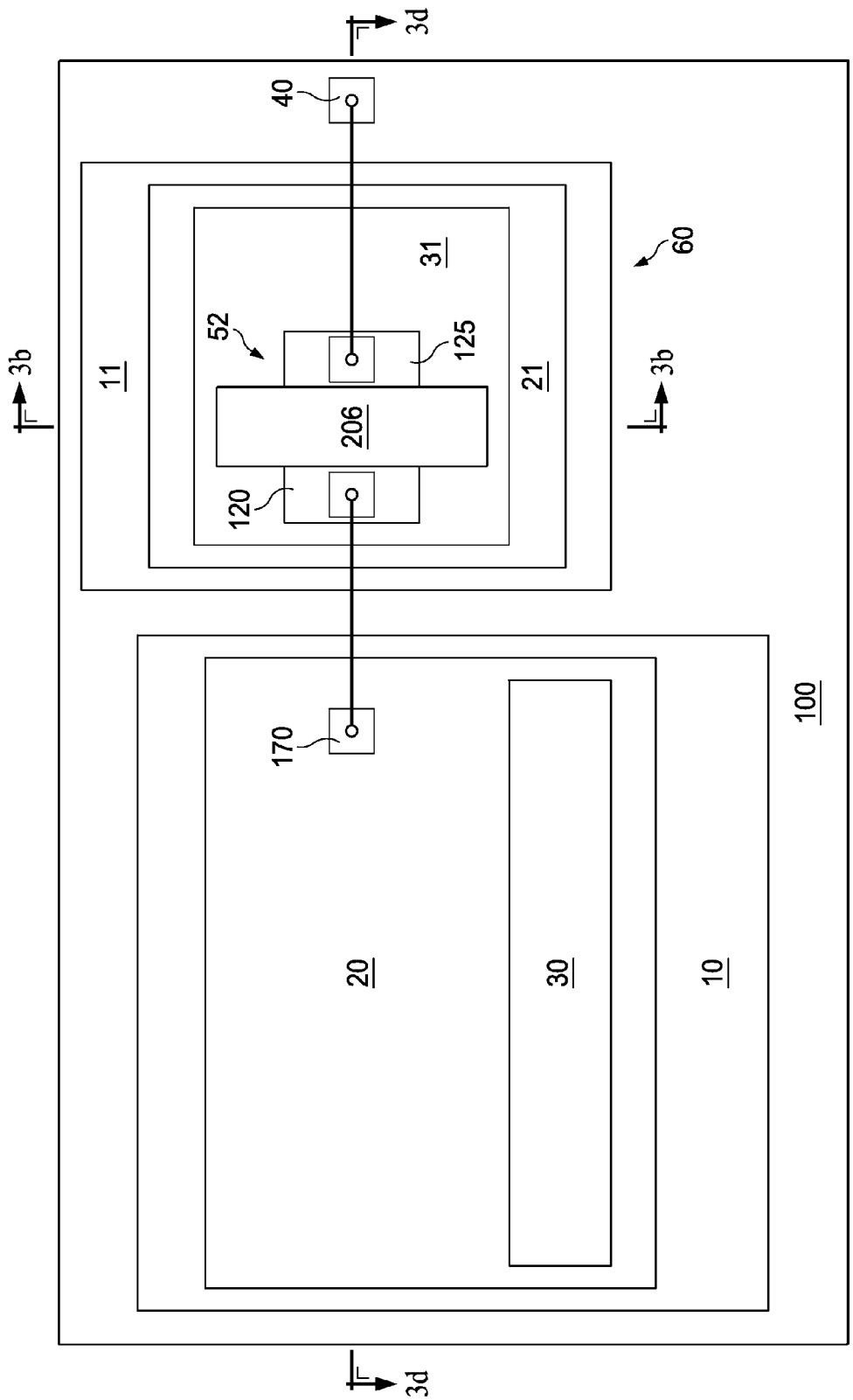
FIGS. 3a-3e, illustrates an alternative embodiment of the discharge device, wherein the discharge device includes an n-channel transistor.

Referring to FIG. 3a, a first well region 10 is disposed over a substrate 100. A second well region 20 is disposed within the first well region 10. A third well region 30 may be disposed within the second well region 20 in some embodiments. A second discharge device 60 is coupled to the second well region 20. The second discharge device 60 is formed over and within a third discharge device well region 31, which is over a second discharge device well region 21 and a first discharge device well region 11. In various embodiments, the first discharge device well region 11, the second discharge device well region 21, and the third discharge device well region 31 are another first well region 10, another second well region 20, and another third well region 30 respectively.

In one embodiment, the first type of doping is a p-type doping, whereas the second type of doping is an n-type doping.

The second discharge device 60 comprises a second transistor 52 having a third source/drain region 120, a fourth source/drain region 125, a second gate region 206 overlying a channel region. In one embodiment, the second transistor 52 is an n-channel metal insulator semiconductor transistor. The third source/drain region 120 is coupled to the second well region 20 through a third well contact 170. An intrinsic or low doped region of the substrate 100 separates the second discharge device 60 from the second well region 20.

In various embodiments, the second transistor 52 is designed to be a low voltage transistor having a low threshold voltage, for example, less than about 0.35 V. For example, in some embodiments, the threshold voltage of the second transistor 52 me be between about 0.05 V and about 0.5 V. The second transistor 52 is designed in its own well construct being insulated from the device array 5.

Figure 3B:
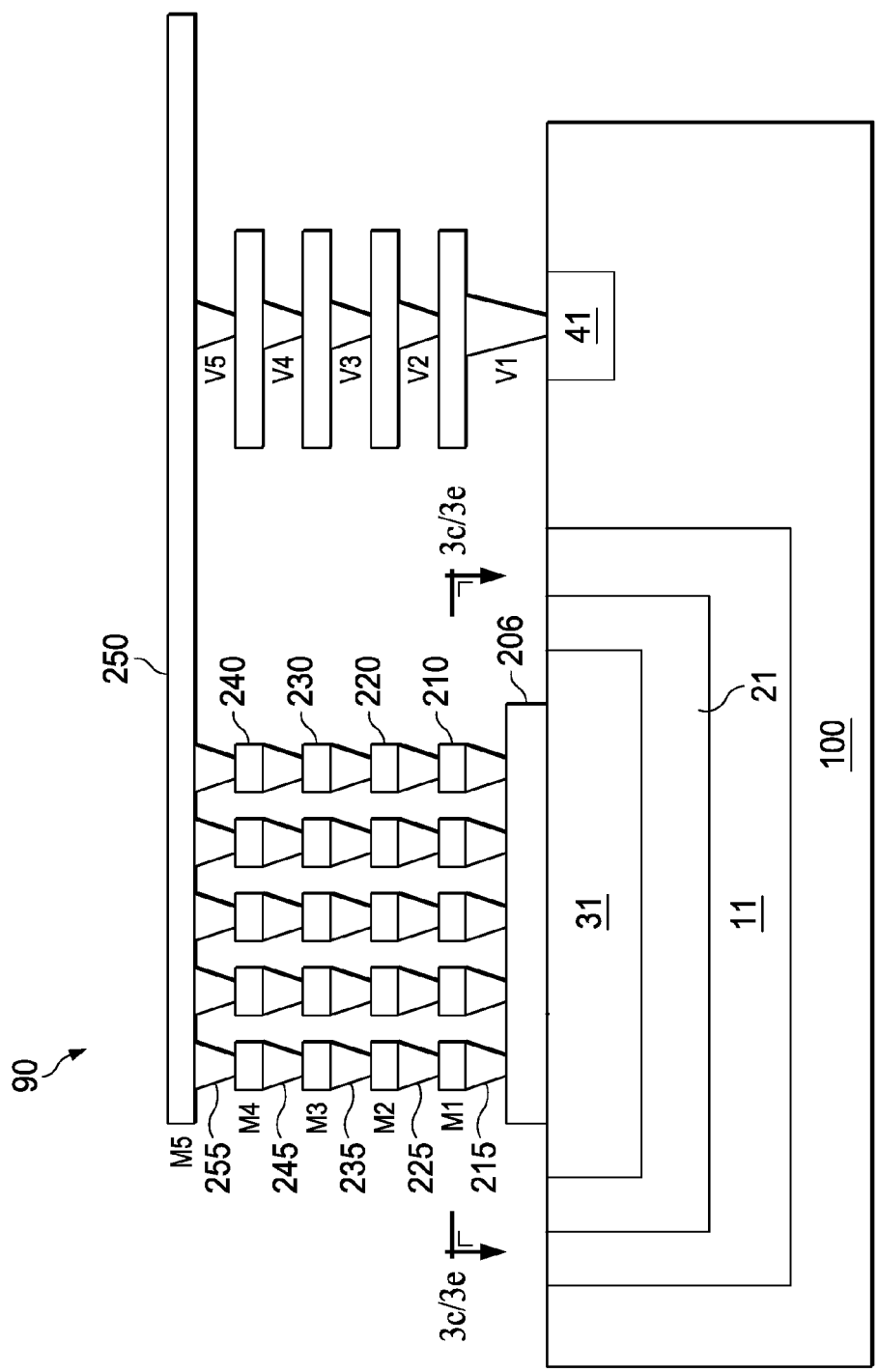

FIG. 3b illustrates a cross sectional view of the semiconductor device along the line 3b-3b in FIG. 3a. As illustrated in FIG. 3b, the second transistor 52 of the second discharge device 60 is formed over a third discharge device well region 31, which is another third well region. For example, the channel region of the second transistor 52 comprises a same type of doping as the third well region 30.

As illustrated in FIG. 3b, a plurality of metallization layers is formed over the third discharge device well region 31. The plurality of metallization layers of the second transistor 52 of the second discharge device 60 form a second antenna 90. The number of metallization layer may be the same as the number of metallization layer over the other regions of the semiconductor device in one embodiment.

Figure 3C:
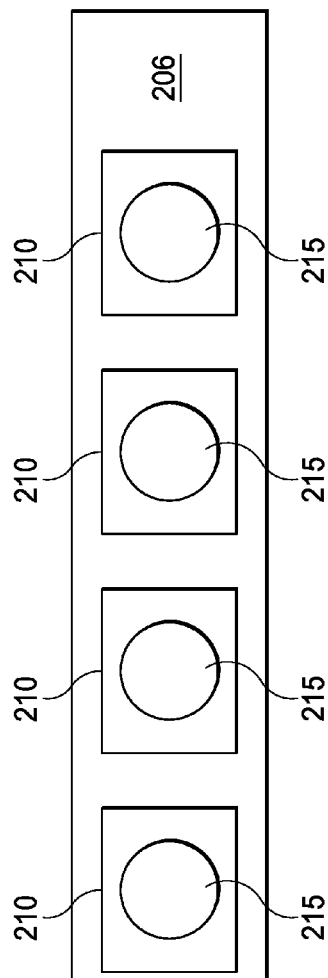

Unlike the prior embodiment, the second antenna 90 is designed to capture positive charge for turning on the n-channel transistor. Consequently, the second antenna 90 is designed to have maximum surface area of vias relative to metal lines. As illustrated in FIGS. 3b and 3c, the surface area of the exposed vias is as large as possible. A minimum via opening results in the highest charging due to the shadowing effect. In one or more embodiments, in each metallization and each via layer, a cumulative surface area of the vias is approximately ¼ of the cumulative surface area of the metallization. Therefore, the second antenna 90 efficiently captures positive charges (holes) during plasma processing.

The second antenna 90 includes first vias 215 in a first via level V1, second vias 225 in a second via level V2, third vias 235 in a third via level V3, fourth vias 245 in a fourth via level V4, fifth vias 255 in a fifth via level V5. The vias are connected through a first metal line 210, a second metal line 220, a third metal line 230, a fourth metal line 240, and a fifth metal line 250. The second antenna 90 may be coupled to the substrate 100, for example, at a ground potential node 41 or a fixed low voltage node, through a higher metal level such as the fifth metal line 250. As in prior embodiments, more or less number of metal levels may be present.

Figure 3E:
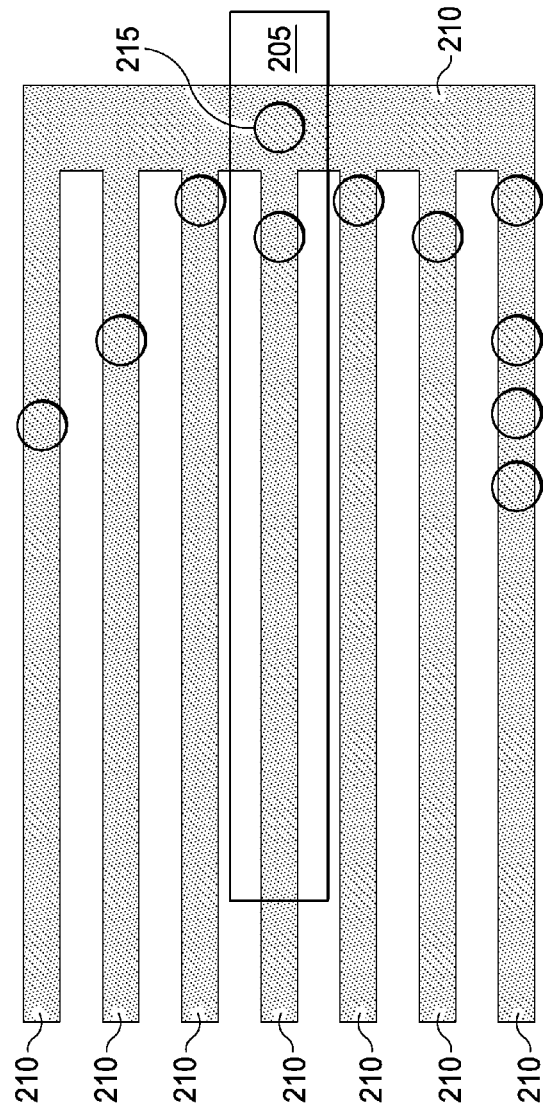

The embodiment of FIG. 3c may be used as an antenna structure for the second antenna 90 in embodiments using copper plating forming stacked vias. FIG. 3e illustrates an alternative embodiment in which the metal lines are formed as a comb shaped structure using aluminum with minimum metal lines spacing and minimum sized vias placed on the metal lines.

Figure 3D:
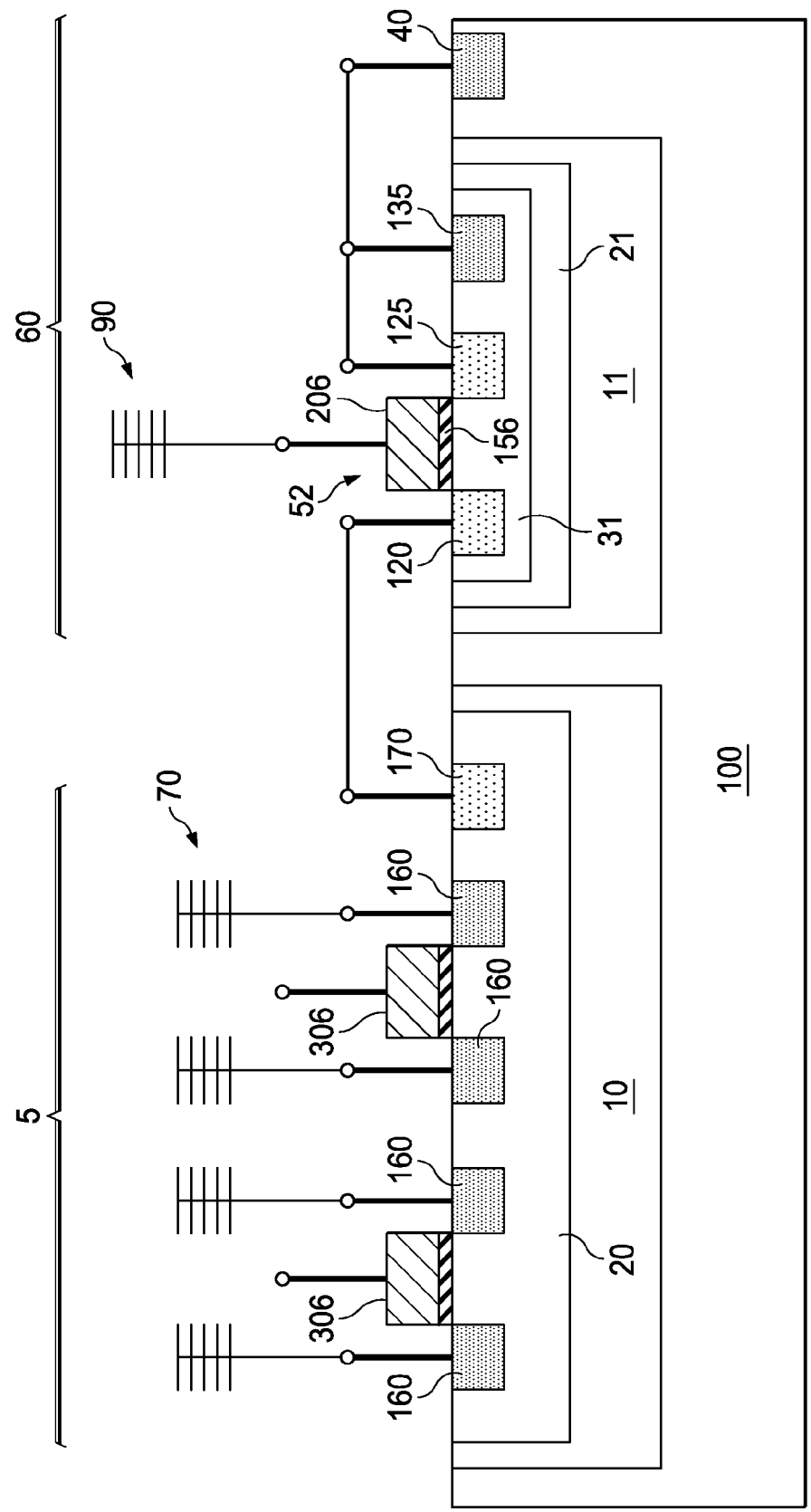

FIG. 3d illustrates a cross sectional view of the semiconductor device along the line 3d-3d in FIG. 3a. For clarity, the structure of the second antenna 90 is illustrated schematically in FIG. 3d.

Referring to FIG. 3d, a portion of the device array 5 includes a plurality of transistors. Similar to the illustration of FIG. 2d, FIG. 3d illustrates the transistors of the device array 5 formed within the second well region 20. Each transistor, e.g., a PMOS transistor, in the device array 5 includes a second array source/drain region 160 disposed within the second well region 20 and array antennas 70, which are described with respect to FIG. 2d.

The second discharge device 60 is coupled, e.g., through first metal level M1 (or through a subsequent higher metal level), to the second well region 20 through a second well contact 170. The second discharge device 60 includes a second transistor 52 having a third source/drain region 120, a fourth source/drain region 125, a second gate region 206 overlying a channel region. The second transistor 52 is formed within another third well region (third discharge device well region 31) having a first type of net doping. A second gate dielectric layer 156 is disposed between the second gate region 206 and the channel region. The fourth source/drain region 125 and optionally a second well contact 135 of the second transistor 52 are tied to a substrate contact 40. The third source/drain region 120 is coupled to the second well contact 170.

In case of an n-channel transistor, accumulation of positive charge in the second gate region 206 may result in formation of an inversion region in the underlying channel region resulting in conduction between the third and the fourth source/drain regions 120 and 125. Thus, during plasma processing any positive charge accumulated in the second well 20 can be discharged when this n-channel transistor turns on. For example, the n-channel transistor turns on, resulting in a flow of electrons from the grounded substrate contact 40 through the fourth source/drain regions 125 into the third source/drain 120 and further into second well contact 170. The electrons can recombine with the excess holes in the second well region 20 by electron-hole recombination processes.

Embodiments of the invention include a combination of embodiments described with respect to FIGS. 2 and 3. Using the combined embodiments, both positive and negative charge accumulation in the second well region 20 and the third well region 30 can be discharged.

Figure 4A:
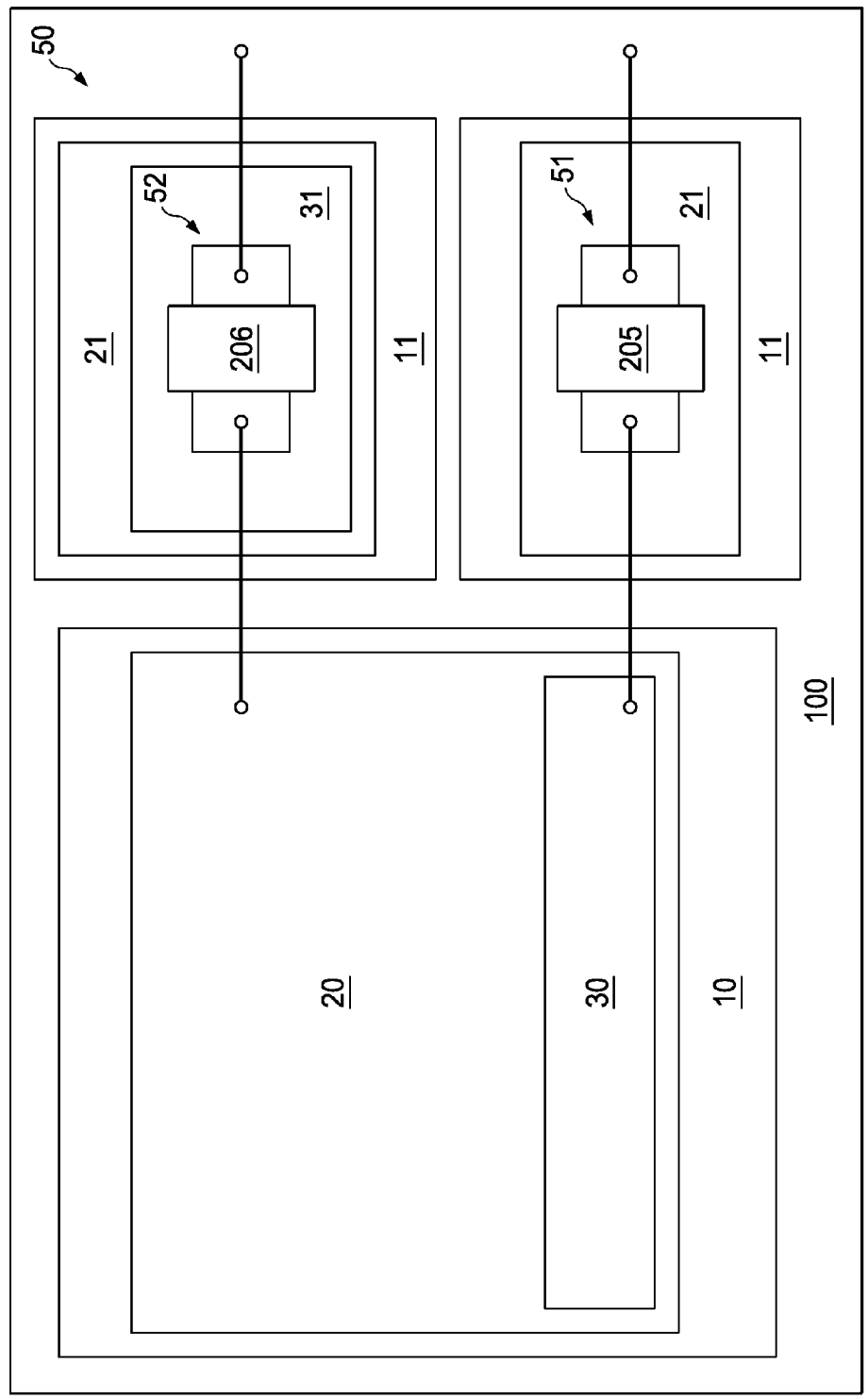
FIGS. 4a and 4b, illustrates discharge devices including both NMOS and PMOS transistors in accordance with an embodiment of the invention.
Figure 4B:
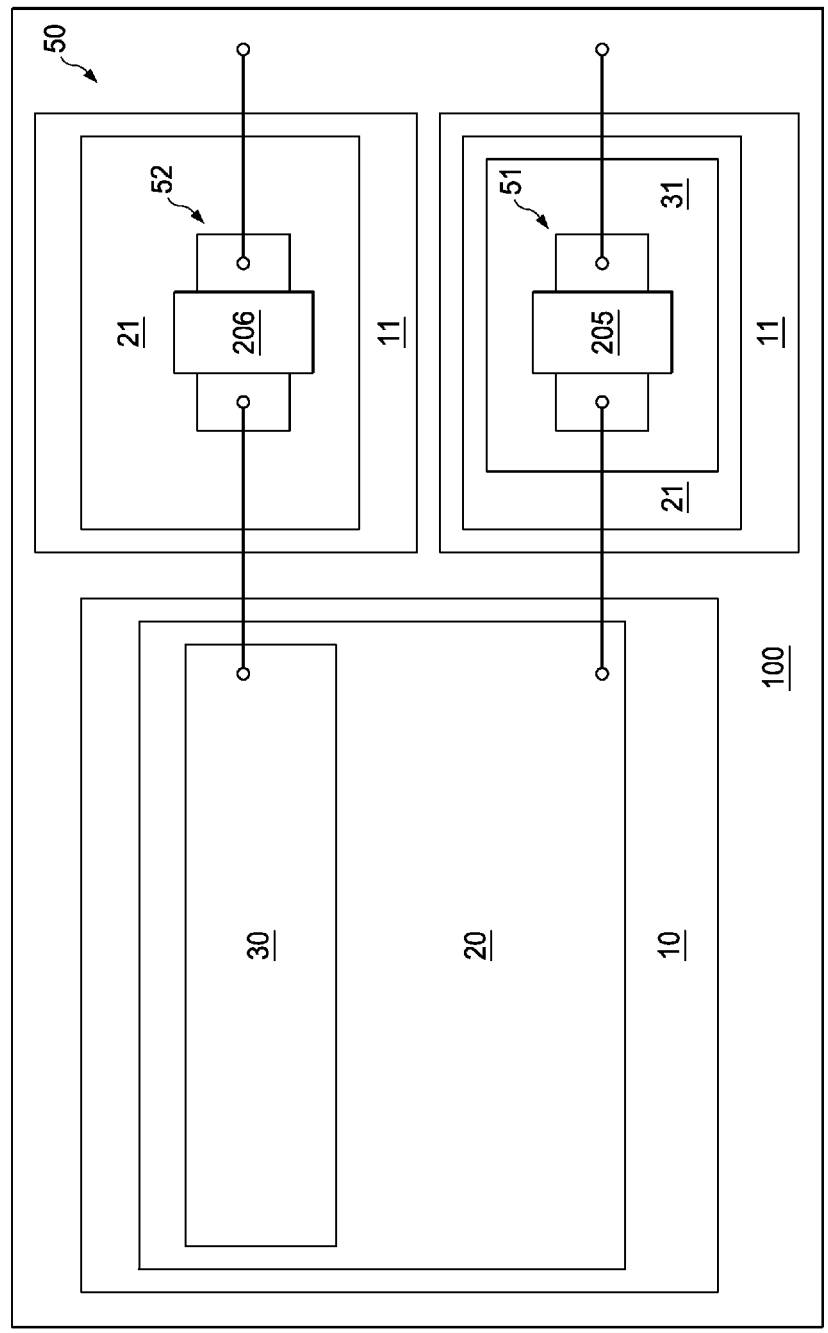

FIG. 4, which includes FIGS. 4a and 4b, illustrates discharge devices including both NMOS and PMOS transistors in accordance with an embodiment of the invention.

FIG. 4a is a top view illustrates a discharge device including a first transistor 51 and a second transistor 52. The first transistor 51 is similar to as described with respect to FIG. 2, while the second transistor 52 is similar to as described with respect to FIG. 3.

FIG. 4a illustrates an embodiment in which the first type of doping is p-type and the second type of doping is n-type. Therefore, the third well region 30 is a p-well and the second well region 20 is an n-well. The first transistor 51 is a p-channel transistor (PMOS), and the second transistor 52 is an n-channel transistor (NMOS). Therefore, the first transistor 51 is formed within the second discharge device well region 21 and the second transistor 52 is formed within the third discharge device well region 31.

Consequently, in this embodiment, an excess of negative charge is removed by injecting holes into the third well region 30 because of the turning on of the first transistor 51 (PMOS transistor). In contrast, an excess positive charge is removed by injecting electrons in to the second well region 20 because of the turning on of the second transistor 52. Thus in this embodiment, the discharge device removes an excess of positive or negative charge from the well regions.

In an alternative embodiment, the first transistor 51 (PMOS transistor) may be coupled to the third well region 30 to discharge negative charge. Similarly, in alternative embodiments, the second transistor 52 (NMOS transistor) may be coupled to the second well region 20 to discharge positive charge. In various embodiments, PMOS transistors are used to discharge negative charge and NMOS transistors are used to discharge positive charge from the well regions.

FIG. 4b illustrates an alternative embodiment in which the first type of doping is n-type and the second type of doping is p-type. Therefore, the third well region 30 is an n-well and the second well region 20 is an p-well. Again, the first transistor 51 is a p-channel transistor (PMOS), and the second transistor 52 is an n-channel transistor (NMOS). However, the first transistor 51 is formed within the third discharge device well region 31 and the second transistor 52 is formed within the second discharge device well region 21.

Figure 5A:
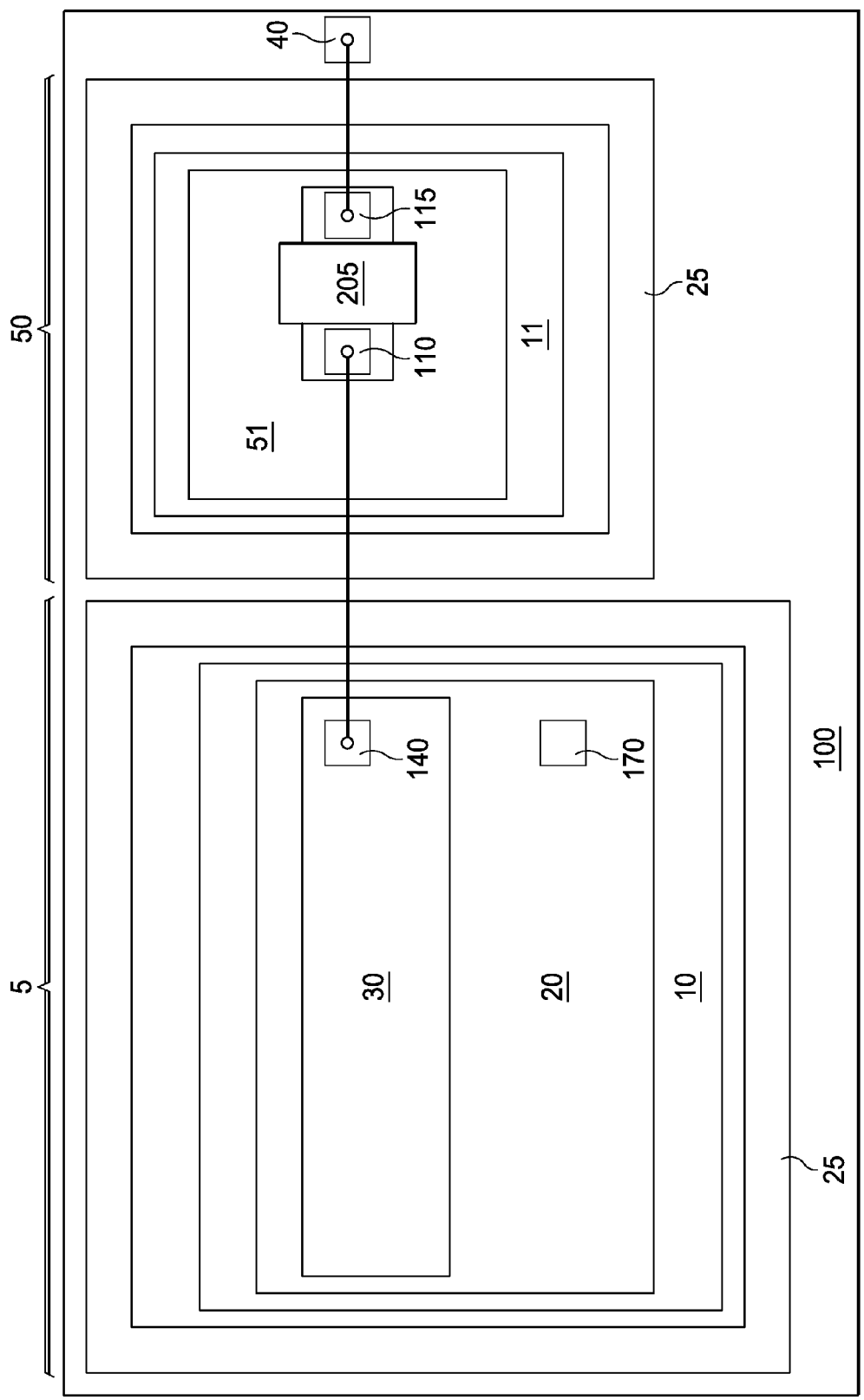
Figure 5B:
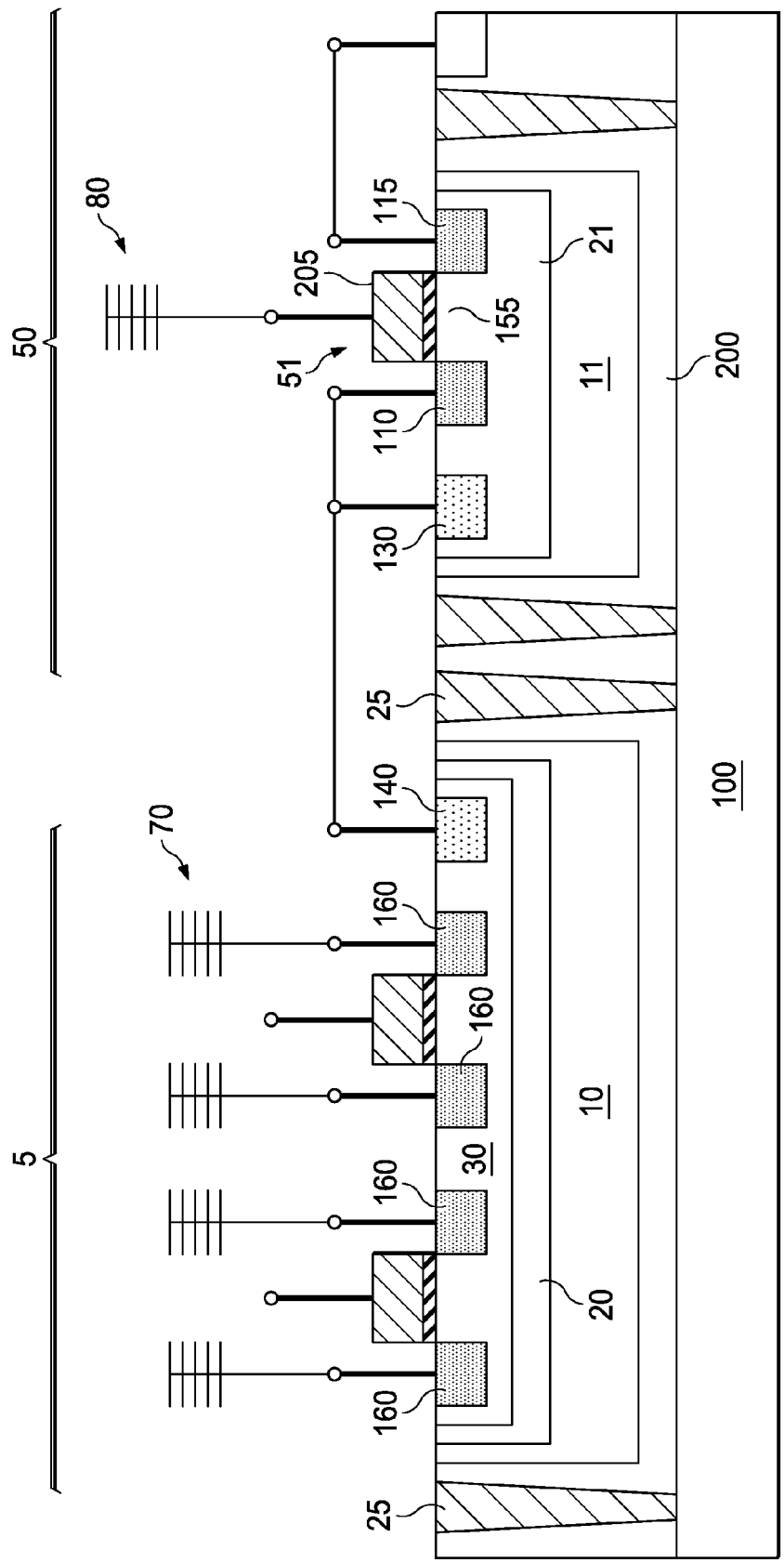

FIG. 5, which includes FIGS. 5a-5b, illustrates a discharge device in accordance with an alternative embodiment of the invention, wherein FIG. 5a illustrates a top view and FIG. 5b illustrates a cross sectional view.

This embodiment differs from the embodiments described with respect to FIG. 2-4 in the use of the deep trenches for improved isolation. The embodiment of FIG. 5 may be implemented in PMOS and/or NMOS discharge transistors for discharging either or both n-wells and/or p-wells. Only as an illustration, the FIG. 5 uses a PMOS transistor as the discharge device for discharging excess negative charge.

Referring to FIG. 5a, a first well region 10, a second well region 20, and a third well region 30 are formed within a substrate 100 as in prior embodiments. The first well region 10 and the third well region 30 comprise a first type of doping, whereas a second well region 20 comprises an opposite second type of doping. In one embodiment, the first type of doping is a p-type doping, whereas the second type of doping is an n-type doping.

A first discharge device 50 is coupled to the third well region 30 as in the prior embodiments (e.g. FIG. 2). The first discharge device 50 comprises a first transistor 51 having a first source/drain region 110, a second source/drain region 115, a first gate region 205 overlying a channel region. In one embodiment, the first transistor 51 is an p-channel metal insulator semiconductor transistor.

As in prior embodiments, the first source/drain region 110 is coupled to the third well region 30 through a third well contact 140. Unlike prior embodiments, deep trenches 25 separate the first discharge device 50 from the second well region 20 and the third well region 30.

In an alternative embodiment, the first source/drain region 110 is coupled to the second well region 20 through a third well contact 170. In both embodiments, the first transistor 51, which is a PMOS transistor, discharges negative charge from the wells.

In an alternative, the discharge device comprises a NMOS transistor for discharging positive charge from the wells.

In various embodiments, the antennas for the PMOS and NMOS transistors (discharge transistors) for the deep trench embodiment of FIG. 5 are formed as described with respect to FIGS. 2 and 3. For example, FIGS. 2c and 2e illustrate the antenna structure for a PMOS discharge transistor, and FIGS. 3c and 3e illustrate the antenna structure for a NMOS discharge transistor.

FIG. 5b illustrates a cross sectional view of the semiconductor device along the line 5b-5b in FIG. 5a. As illustrated in FIG. 5b, the first transistor 51 of the first discharge device 50 is formed over the second discharge device well region 21. For example, the channel region of the first transistor 51 comprises a same type of doping as the second discharge device well region 21.

As illustrated in FIG. 5b, a first antenna 80 is formed by a plurality of metallization layers over the third well region 30 as in prior embodiments (see, e.g., FIG. 3).

As in the prior embodiment, the first antenna 80 is designed to capture negative charge for turning on the p-channel transistor during plasma processing.

As illustrated in FIG. 5b, the deep trenches 25 may be conducting and may include a core region comprising conductive material and an outer insulating region surrounding the core region. This helps to contact the substrate when the wells are tightly spaced. Thus the second source/drain 115 is coupled to the substrate through the deep trenches 25. FIG. 5b also illustrates an optional epitaxial layer 200 formed over the substrate 100.

In another embodiement, other well constellation in the device array region 5 are possible, such as e.g., only the first well region 10 without the second well region 20 and/or the third well region 30 forms the semiconductor device, which can be combined with the first or the second discharge devices 50 or 60 for discharging. In various embodiments, the discharge devices can also be placed directly within the first well region 10 only instead of within the third well region 30, which is inside the second well region 20.

Figure 6:
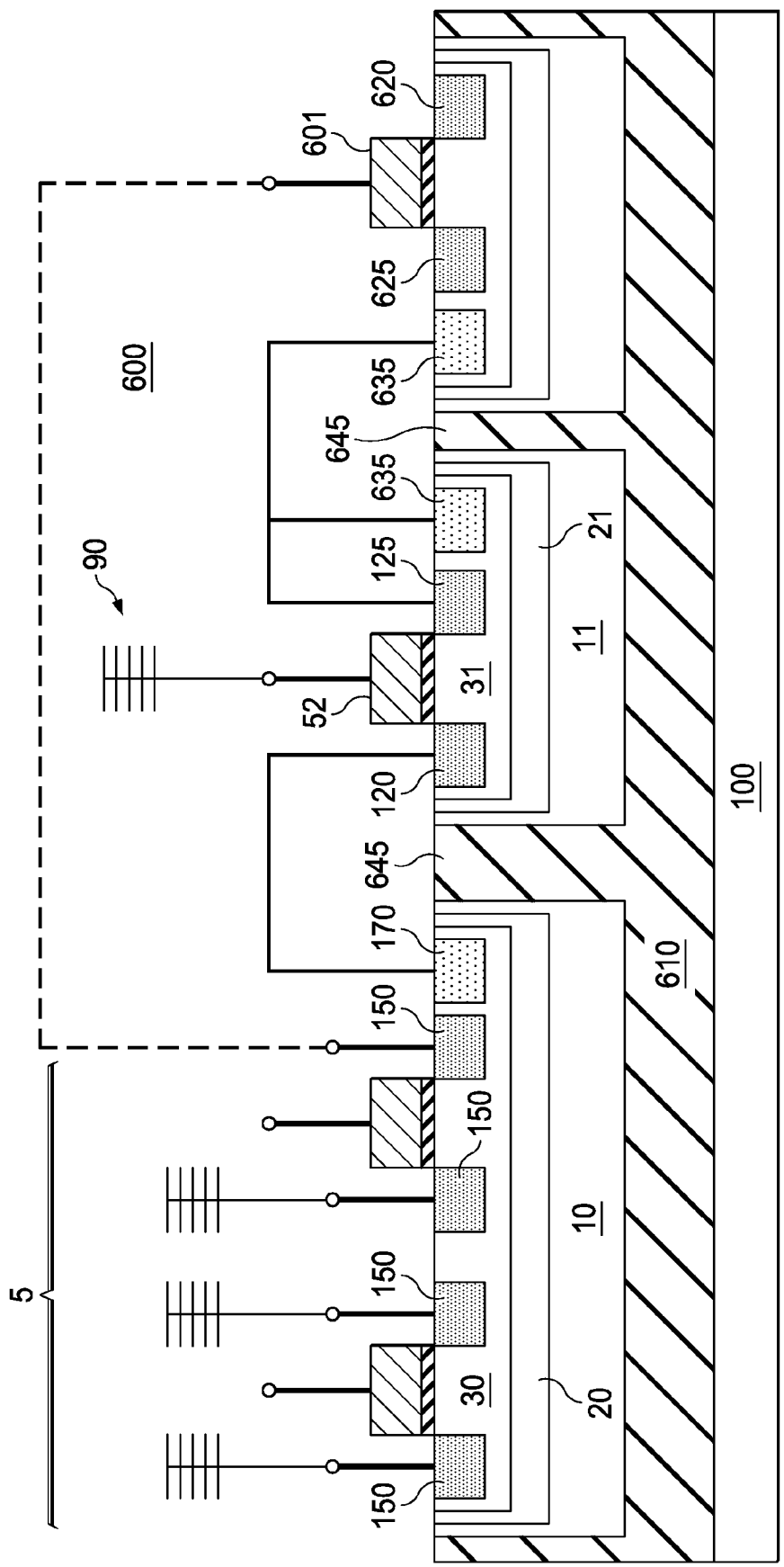
FIG. 6 illustrates a cross sectional view of a discharge device having a silicon on insulator substrate in accordance with an alternative embodiment of the invention.

FIG. 6 illustrates a cross sectional view of a discharge device having a silicon on insulator substrate in accordance with an alternative embodiment of the invention.

Referring to FIG. 6, a first well region 10, a second well region 20, and a third well region 30 are formed within a substrate 100 as in prior embodiments. The substrate 100 includes an insulator layer 610. The well regions are separated by isolation regions 645.

A device array 5 including transistors having first source/drain regions 150 are formed as in prior embodiments within the wells. A third well contact 170 is formed for coupling the third well region 30.

FIG. 6 also illustrates a third transistor 601 separated from the device array 5. The gate of the third transistor 601 is coupled to the first source/drain region 150 within the third well region 30.

However, because of the differences in the antennas feeding into the well region of the device array 5 and the well region of the third transistor 601, the well regions of the third transistor 601 may be at a different potential than the well regions of the device array 5. Because of the coupling of the gate electrode of the fourth transistor 604 with the well region of the device array 5, the gate dielectric of the fourth transistor 604 may breakdown due to potential buildup in the gate electrode.

Embodiments of the invention avoid this by transferring charge from the well region of the device array 5 into the well regions of the fourth transistor 604, which in turn reduces the potential difference between the gate electrode and channel region of the fourth transistor 604.

In various embodiments, the use of a discharge transistor to equilibrate potential of two isolated well regions may be used in any of the embodiments described previously, for example, in FIGS. 2-6.

The discharge device 600 comprises a second transistor 52, for example, as described in FIG. 3. The second transistor 52 comprises a third source/drain region 120 and a fourth source/drain region 125 and a third substrate contact 635.

Similarly, the third transistor 601 comprises a first source/drain region 620 and a second source/drain region 625 and a third well contact 635.

The third substrate contact 635 of the third transistor 601 is coupled to the second substrate contact 135 of the second transistor 52 and the fourth source/drain region 125 of the second transistor 52. The third source/drain region 120 of the second transistor 52 is coupled to the third well region 30 through the third well contact 170.

The gate of the second transistor 52 comprises an antenna structure. In case of a NMOS transistor, the antenna structure comprises a second antenna 90 as described in FIGS. 3c and 3e.

The second transistor 52 turns on when excess positive charge builds up in the gate of the transistor. Subsequently, excess negative charge from the third well region 30 can flow from the third well contact 170 into the third source/drain 120 to the fourth source/drain regions 125 and through the second substrate contact 635 of the second transistor 52 and further to the third well contact 635 of the third transistor 601. As a result, any potential differences between well of the device array region 5 and well of the transistor 601 is levelled off FIG. 7 illustrates a semiconductor device having both NMOS and PMOS discharge transistor coupled to the well regions in accordance with embodiments.

Figure 7:
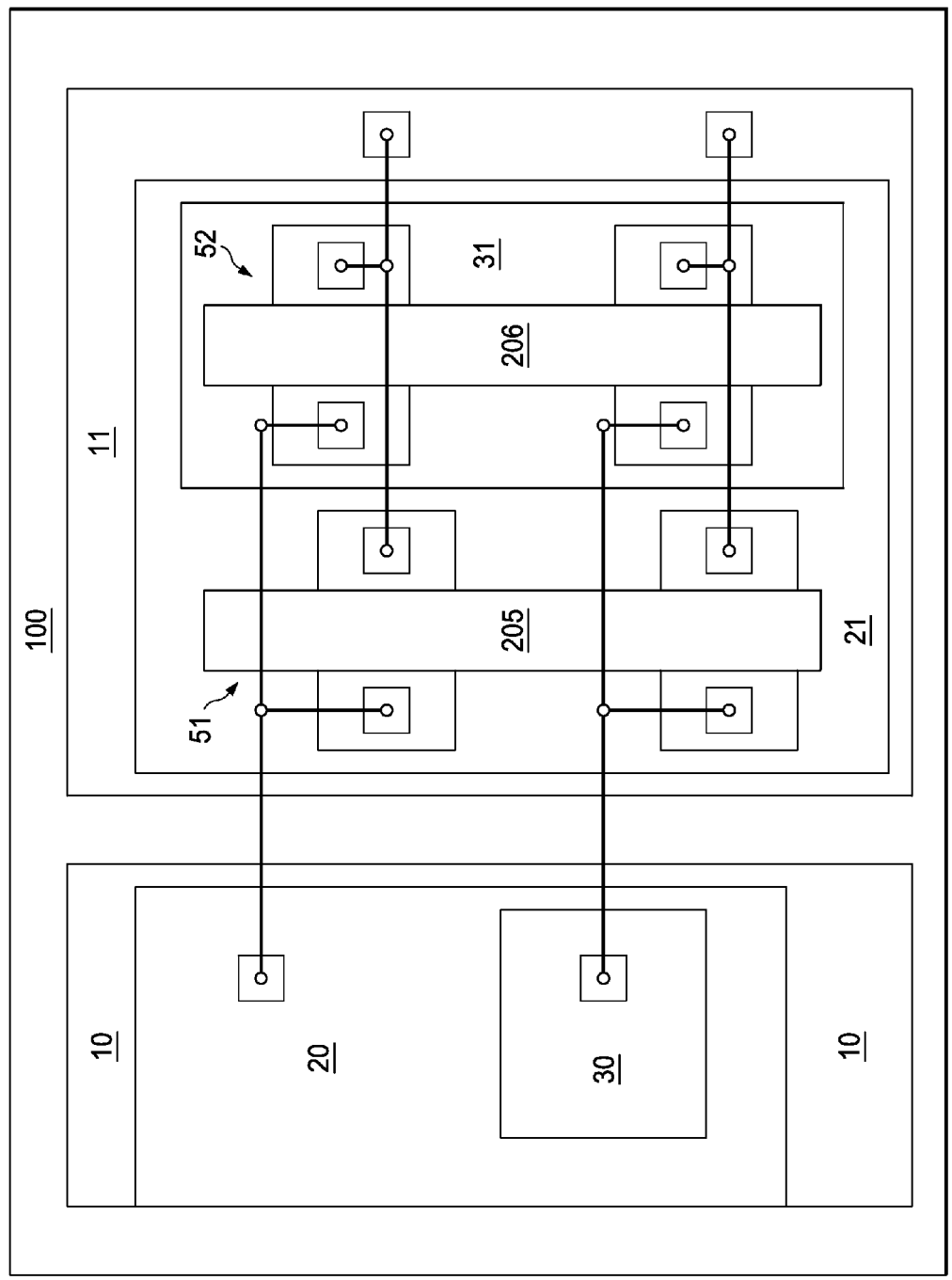
FIG. 7 illustrates a semiconductor device having both NMOS and PMOS discharge transistor coupled to the well regions in accordance with embodiments.

As illustrated in FIG. 7, in various embodiments, the embodiments described with respect to FIGS. 2 and 3 may be combined in forming the semiconductor device illustrated in FIG. 1. Unlike the embodiment of FIG. 4, the illustrated embodiment contacts both the n-well and p-well by both the NMOS and PMOS transistors.

Figure 8:
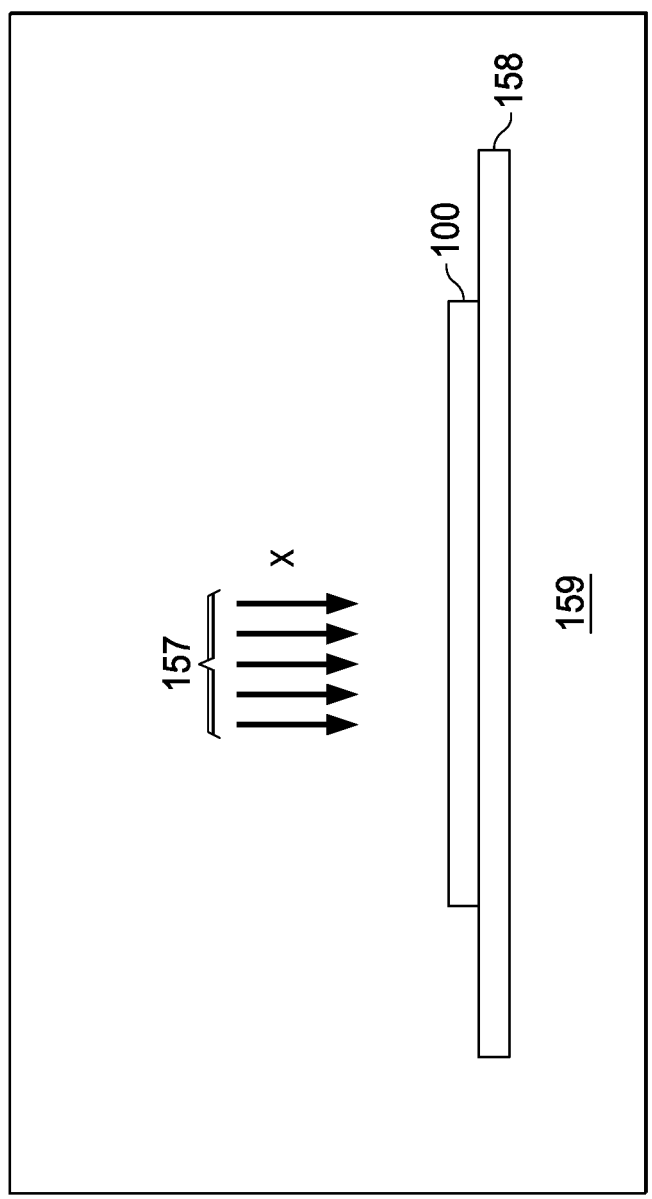
FIG. 8 illustrates a substrate during semiconductor processing in accordance with embodiments of the invention.

FIG. 8 illustrates a substrate during semiconductor processing in accordance with embodiments of the invention.

As illustrated in FIG. 8 during the formation of the metallization layers, the substrate 100 (e.g., wafer) may be placed inside a plasma chamber 159 over a chuck 158. The substrate 100 through its back side (e.g., via the chuck 158) may be coupled to a low voltage node or ground potential node.

The substrate 100 may be exposed to a plasma 157 and the substrate 100 may collect negative or positive charge. As described above in various embodiments, because of the discharge device, excess negative charge or excess positive charge in the well regions can be discharged.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a well region comprising a plurality of transistors disposed in a substrate; and
   a first discharge device comprising a first transistor having a first source/drain region, a second source/drain region, and a first gate region, wherein the first source/drain region is coupled to the well region, wherein the second source/drain region is coupled to a low voltage node, wherein the first gate region is coupled to a first antenna, and wherein the first transistor is disposed within a third well region which is disposed within a second well region, which is disposed within a first well region.

2. The semiconductor structure of claim 1, wherein the first source/drain region is coupled to a well contact having the same doping as the well region.

3. The semiconductor structure of claim 1, wherein the low voltage node is a ground potential node.

4. The semiconductor structure of claim 1, wherein the first discharge device is isolated from the well region by low doped or intrinsic region of the substrate.

5. The semiconductor structure of claim 1, wherein the substrate is a bulk silicon substrate.

6. A semiconductor structure comprising:
 a well region comprising a plurality of transistors disposed in a substrate; and
 a first discharge device comprising a first transistor having a first source/drain region a second source/drain region, and a first gate region, wherein the first source/drain region is coupled to the well region wherein the second source/drain region is coupled to a low voltage node, wherein the first gate region is coupled to a first antenna, wherein the first antenna comprises vias and metal lines disposed within metallization layers over the first gate region.

7. The semiconductor structure of claim 6, wherein the first antenna is coupled via a last metal level of the metallization layer to a ground potential node and configured to switch off the first transistor.

8. The semiconductor structure of claim 6, wherein in each metallization layer a surface area of the vias is maximized relative to a surface area of the metal lines.

9. The semiconductor structure of claim 8, wherein the first transistor is an n-channel metal insulator semiconductor transistor.

10. The semiconductor structure of claim 6, wherein, in each metallization layer, a surface area of the metal lines is larger than a surface area of the vias.

11. The semiconductor structure of claim 10, wherein the area of the vias is configured to be minimized for a given design rule.

12. The semiconductor structure of claim 11, wherein the first transistor is an p-channel metal insulator semiconductor transistor.

13. The semiconductor structure of claim 6, wherein the first transistor is an p-channel metal insulator semiconductor transistor.

14. A semiconductor structure comprising:
 a well region comprising a plurality of transistors disposed in a substrate;
 a first discharge device comprising a first transistor having a first source/drain region, a second source/drain region, and a first gate region, wherein the first source/drain region is coupled to the well region, wherein the second source/drain region is coupled to a low voltage node, and wherein the first gate region is coupled to a first antenna; and
 a second transistor having a third source/drain region, a fourth source/drain region, and a second gate region, wherein the third source/drain region is coupled to the well region, wherein the fourth source/drain region is coupled to the low voltage node, wherein the second gate region is coupled to a second antenna, wherein the first transistor is a different type of transistor from the second transistor.

15. The semiconductor structure of claim 14, wherein the first transistor is a p-channel metal insulator semiconductor transistor, and wherein the second transistor is an n-channel metal insulator semiconductor transistor.

16. A semiconductor structure comprising:
 a well region comprising a plurality of transistors disposed in a substrate; and
 a first discharge device comprising a first transistor having a first source/drain region, a second source/drain region, and a first gate region, wherein the first source/drain region is coupled to the well region wherein the second source/drain re ion is coupled to a low voltage node, wherein the first gate region is coupled to a first antenna, and wherein the first discharge device is isolated from the well region by a deep trench.

17. A method of fabricating a semiconductor structure, the method comprising:
 forming a first well region comprising a plurality of transistors in a first region of a substrate;
 forming a second well region in a second region of the substrate;
 forming a first discharge device in the substrate, the first discharge device being coupled between the first well region and the second well region; and
 transferring charge from the first well region to the second well region through the first discharge device during subsequent steps of fabricating the semiconductor structure.

18. The method of claim 17, wherein the first discharge device comprises a first transistor having a first source/drain region, a second source/drain region, and a first gate region, wherein the first source/drain region is coupled to the first well region, wherein the second source/drain region is coupled to the second well region, wherein the first gate region is coupled to a first antenna.

19. The method of claim 18, wherein the second well region comprises a second transistor having a gate electrode coupled to the plurality of transistors in the first well region.

20. The method of claim 18, wherein the first discharge device is an n-channel transistor.

21. The method of claim 20, wherein the first antenna comprises vias and metal lines disposed within metallization layers over the first gate region, and wherein in each metallization layer a surface area of the vias is maximized relative to a surface area of the metal lines.

22. The method of claim 18, wherein the first discharge device is a p-channel transistor.

23. The method of claim 22, wherein the first antenna comprises vias and metal lines disposed within metallization layers over the first gate region, and wherein, in each metallization layer, a surface area of the metal lines is larger than a surface area of the vias, and wherein the vias are configured to minimize a surface area of the vias for a given design rule.

24. The method of claim 17, wherein the first well region and the second well region are separated by a deep trench region.

25. The method of claim 17, wherein the first well region and the second well region are separated by an isolation region.

26. The method of claim 17, wherein the first well region and the second well region are separated by low doped or intrinsic region of the substrate.

27. The method of claim 17, wherein the substrate is a bulk silicon substrate.

28. The method of claim 17, wherein the substrate is a silicon on insulator substrate.

29. A method of fabricating a semiconductor device, the method comprising:

forming a first well region having a first doping type within a substrate;

forming a second well region having a second doping type within the first well region, the second doping type being opposite to the first doping type;

forming a third well region having the first doping type within the second well region, the third well region comprising a plurality of transistors;

forming a first transistor within and/or above the substrate, the first transistor being coupled between the third well region and a low voltage node; and during subsequent fabrication of the semiconductor device, discharging charge accumulated in the third well region using the first transistor.

30. The method of claim 29, wherein the first transistor comprises a first source/drain region, a second source/drain region, and a first gate region, wherein the first source/drain region is coupled to the third well region, wherein the second source/drain region is coupled to the low voltage node, and wherein the first gate region is coupled to a first antenna.

31. The method of claim 30, further comprising:

forming a second transistor disposed within and/or above the substrate, the second transistor having a third source/drain region, a fourth source/drain region, and a second gate region, wherein the third source/drain region is coupled to the second well region, wherein the fourth source/drain region is coupled to the low voltage node, wherein the second gate region is coupled to a second antenna; and during subsequent fabrication of the semiconductor device, discharging charge accumulated in the third well region using the second transistor.

32. The method of claim 31, further comprising:

forming a third transistor disposed within and/or above the substrate, the third transistor having a fifth source/drain region, a sixth source/drain region, and a third gate region, wherein the fifth source/drain region is coupled to the second well region, wherein the sixth source/drain region is coupled to the low voltage node, wherein the third gate region is coupled to a third antenna; and during subsequent fabrication of the semiconductor device, discharging charge accumulated in the third well region using the third transistor.

33. The method of claim 32, wherein the first antenna is coupled to the third antenna.

34. The method of claim 32, further comprising:

forming a fourth transistor disposed within and/or above the substrate, the fourth transistor having a seventh source/drain region, a eighth source/drain region, and a fourth gate region, wherein the seventh source/drain region is coupled to the third well region, wherein the eighth source/drain region is coupled to the low voltage node, wherein the fourth gate region is coupled to a fourth antenna; and during subsequent fabrication of the semiconductor device, discharging charge accumulated in the third well region using the fourth transistor.

35. The method of claim 34, wherein the second antenna is coupled to the fourth antenna.

36. A method of forming a semiconductor device, the method comprising:

forming a well region within a substrate;

forming a plurality of transistors within and/or over the well region;

forming a first discharge device within the substrate, the first discharge device comprising a first transistor having a first source/drain region, a second source/drain region, and a first gate region, wherein the first source/drain region is coupled to the well region, wherein the second source/drain region is coupled to a low voltage node;

forming a first portion of a first antenna over or next to the first gate region, the first gate region being coupled to the first portion of the first antenna; and forming a first metallization layer over the well region using a first plasma process, wherein the first discharge device is configured to conduct during the first plasma process.

37. The method of claim 36, further comprising:

forming a second portion of the first antenna over the first portion; and forming a second metallization layer over the first metallization layer using a second plasma process.

38. The method of claim 36, wherein the first transistor is an n-channel metal insulator semiconductor transistor, wherein the first antenna comprises vias and metal lines disposed over the first gate region, and wherein a surface area of the vias is designed to be maximized relative to a surface area of the metal lines.

39. The method of claim 36, wherein the first transistor is a p-channel metal insulator semiconductor transistor, wherein the first antenna comprises vias and metal lines disposed over the first gate region, and wherein a surface area of the metal lines is larger than a surface area of the vias.

40. The method of claim 39, wherein the first transistor is connected to the first antenna which is connected via last metal to a high voltage node having a positive bias configured to switch off the first transistor transistor.

41. The method of claim 36, wherein the low voltage node is a ground potential node, and wherein the second source/drain region is coupled to the low voltage node through a chuck holding the substrate.

* * * * *

UNITED STATES PATENT AND TRADEMARK OFFICE
CERTIFICATE OF CORRECTION

PATENT NO. : 8,541,845 B2  Page 1 of 1
APPLICATION NO. : 13/004334
DATED : September 24, 2013
INVENTOR(S) : Alfred Schuetz It is certified that error appears in the above-identified patent and that said Letters Patent is hereby corrected as shown below:

In the Claims:

In Col. 13, line 18, claim 6, delete "region a" and insert --region, a--.
In Col. 13, line 20, claim 6, delete "region wherein" and insert --region, wherein--.
In Col. 14, line 9, claim 16, delete "region wherein" and insert --region, wherein--.
In Col. 14, line 10, claim 16, delete "re ion" and insert --region--.

Signed and Sealed this
Seventh Day of January, 2014

Margaret A. Focarino
*Commissioner for Patents of the United States Patent and Trademark Office*